United States Patent
Kunimune et al.

(10) Patent No.: US 12,447,528 B2
(45) Date of Patent: Oct. 21, 2025

(54) RESIN IMPREGNATION METHOD, METHOD OF MANUFACTURING WAVELENGTH-CONVERSION MODULE, AND WAVELENGTH-CONVERSION MODULE

(71) Applicant: Nichia Corporation, Anan (JP)

(72) Inventors: Teppei Kunimune, Tokushima (JP); Masafumi Kuramoto, Tokushima (JP)

(73) Assignee: NICHIA CORPORATION, Anan (JP)

(*) Notice: Subject to any disclaimer, the term of this patent is extended or adjusted under 35 U.S.C. 154(b) by 280 days.

(21) Appl. No.: 18/226,642

(22) Filed: Jul. 26, 2023

(65) Prior Publication Data

US 2023/0364676 A1     Nov. 16, 2023

Related U.S. Application Data

(62) Division of application No. 17/229,043, filed on Apr. 13, 2021, now Pat. No. 11,752,551.

(30) Foreign Application Priority Data

Apr. 15, 2020    (JP) .................... 2020-072941

(51) Int. Cl.
     *B22F 3/26*      (2006.01)
     *B05D 3/04*      (2006.01)
     (Continued)

(52) U.S. Cl.
CPC .............. *B22F 3/26* (2013.01); *B05D 3/0493* (2013.01); *B22F 7/004* (2013.01); *B22F 7/04* (2013.01);
(Continued)

(58) Field of Classification Search
CPC ........................................... B22F 3/26
See application file for complete search history.

(56) References Cited

U.S. PATENT DOCUMENTS 4,208,472 A * 6/1980 Cho ............... F16C 33/208
                                             29/898.059
5,593,625 A      1/1997 Riebel et al.
(Continued)

FOREIGN PATENT DOCUMENTS

| | | |
|---|---|---|
| JP | 9-153514 A | 6/1997 |
| JP | 11-54662 A | 2/1999 |

(Continued)

OTHER PUBLICATIONS

Non-Final Rejection issued in U.S. Appl. No. 17/229,043, mailed on Dec. 19, 2022.
(Continued)

*Primary Examiner* — Andrew T Piziali
(74) *Attorney, Agent, or Firm* — Birch, Stewart, Kolasch & Birch, LLP

(57) ABSTRACT

A method of impregnating voids of a sintered metal body having a porous structure with resin, the method comprising preparing a resin material that contains a defoamer containing hydrophilic or hydrophobic particles, defoaming the prepared resin material by reducing pressure of the resin material, applying the defoamed resin material onto a surface of the sintered metal body, impregnating the voids with the resin material by reducing pressure of the sintered metal body and the resin material applied to the surface of the sintered metal body so as to expel gas from the voids; and curing the resin material by heating.

9 Claims, 4 Drawing Sheets

(51) Int. Cl.
  *B22F 7/00* (2006.01)
  *B22F 7/04* (2006.01)
  *B22F 7/06* (2006.01)
  *B32B 9/00* (2006.01)
  *B32B 15/04* (2006.01)

(52) U.S. Cl.
  CPC .............. *B22F 7/062* (2013.01); *B32B 9/005* (2013.01); *B32B 15/043* (2013.01); *B32B 15/046* (2013.01); *B05D 2202/00* (2013.01); *B05D 2504/00* (2013.01); *B05D 2601/22* (2013.01); *B22F 2007/045* (2013.01); *B32B 2307/422* (2013.01)

(56) References Cited

U.S. PATENT DOCUMENTS

| | | | |
|---|---|---|---|
| 6,049,038 | A | 4/2000 | Suzuki |
| 2005/0069648 | A1 | 3/2005 | Maruyama |
| 2011/0192630 | A1 | 8/2011 | Ishino et al. |
| 2011/0216550 | A1 | 9/2011 | Koike et al. |
| 2011/0290863 | A1 | 12/2011 | Kajiwara et al. |
| 2014/0264383 | A1 | 9/2014 | Kajiwara et al. |
| 2015/0295153 | A1 | 10/2015 | Kuramoto et al. |
| 2016/0040857 | A1 | 2/2016 | Inoue et al. |
| 2016/0370696 | A1 | 12/2016 | Akiyama |
| 2017/0291143 | A1 | 10/2017 | Zhou et al. |
| 2018/0277720 | A1* | 9/2018 | Zheng ................ C09K 11/0883 |
| 2018/0358178 | A1 | 12/2018 | Saeki |
| 2019/0189866 | A1 | 6/2019 | Kuramoto et al. |
| 2019/0243224 | A1 | 8/2019 | Yamada et al. |
| 2019/0264894 | A1 | 8/2019 | Aketa |
| 2019/0294032 | A1 | 9/2019 | Hirano et al. |
| 2020/0058830 | A1 | 2/2020 | Furuyama |
| 2021/0317367 | A1* | 10/2021 | Tatami ................ H10H 20/8512 |

FOREIGN PATENT DOCUMENTS

| | | |
|---|---|---|
| JP | 11-354575 A | 12/1999 |
| JP | 2011-165871 A | 8/2011 |
| JP | 2011-249257 A | 12/2011 |
| JP | 2012-109636 A | 6/2012 |
| JP | 2013-168545 A | 8/2013 |
| JP | 2013-229174 A | 11/2013 |
| JP | 2014-27095 A | 2/2014 |
| JP | 5510646 B2 | 6/2014 |
| JP | 2014-157898 A | 8/2014 |
| JP | 2014-179541 A | 9/2014 |
| JP | 2015-213157 A | 11/2015 |
| JP | 2017-138470 A | 8/2017 |
| JP | WO2018/042825 A1 | 3/2018 |
| JP | 2018-154852 A | 10/2018 |
| JP | WO2018/230333 A1 | 12/2018 |
| JP | 2019-86624 A | 6/2019 |
| JP | 6536202 B2 | 7/2019 |
| JP | 2019-138327 A | 8/2019 |
| JP | 2019-207761 A | 12/2019 |
| JP | 2020-4497 A | 1/2020 |
| WO | WO 2014/065051 A1 | 5/2014 |
| WO | WO 2018/042826 A1 | 3/2018 |

OTHER PUBLICATIONS

Notice of Allowance issued in U.S. Appl. No. 17/229,043, mailed on Jun. 9, 2023.
Restriction Requirement issued in U.S. Appl. No. 17/229,043, mailed on Jul. 19, 2022.

* cited by examiner

RESIN IMPREGNATION METHOD, METHOD OF MANUFACTURING WAVELENGTH-CONVERSION MODULE, AND WAVELENGTH-CONVERSION MODULE

CROSS-REFERENCE TO RELATED APPLICATION

This application is a Divisional of U.S. application Ser. No. 17/229,043, filed on Apr. 13, 2021, which claims priority under 35 U.S.C. § 119(a) to Application No. 2020-072941, filed in Japan on Apr. 15, 2020, all of which are hereby expressly incorporated by reference into the present application.

BACKGROUND OF THE INVENTION

Field of the Invention

The present disclosure relates to a resin impregnation method, a method of manufacturing a wavelength conversion module, and a wavelength conversion module.

Description of the Related Art

In recent years, high-output light sources that convert the wavelength of blue light from semiconductor lasers by using phosphors have been widely used as light sources for headlamps, various illumination devices, laser projectors, and the like. The phosphor in such a light source generates heat along with the conversion of wavelength, which requires the light source to efficiently release the heat generated from the phosphor. In particular, wavelength-conversion devices employed in light sources using semiconductor lasers are required to use wavelength-conversion members with excellent durability and to efficiently release heat generated from the wavelength-conversion members.

In order to meet these requirements, Japanese Patent Publication No. 2019-207761 discloses a wavelength-conversion device (also called a wavelength-conversion module) that uses a ceramic phosphor as a wavelength-conversion member and joins the ceramic phosphor to a heat dissipation member using a joining portion having a sintered structure. According to JP 2019-207761 A, high thermal conductivity can be obtained by using the joining portion having the sintered structure that contains at least one of silver, gold, or copper.

SUMMARY OF THE INVENTION

However, there have been growing demands for light sources with higher output and also wavelength-conversion modules with higher reliability that are suitable for use in the light source and include wavelength-conversion members.

An object of the present disclosure is to provide a resin impregnation method that enables manufacture of a wavelength-conversion module with high reliability.

Another object of the present disclosure is to provide a wavelength-conversion module with high reliability and a method of manufacturing the wavelength-conversion module.

A resin impregnation method according to the present disclosure is a method of impregnating voids of a sintered metal body having a porous structure with resin, the method including: preparing a resin material that contains a defoamer containing hydrophilic or hydrophobic particles; defoaming the prepared resin material by reducing pressure of the resin material; applying the defoamed resin material onto a surface of the sintered metal body; impregnating the voids with the resin material by reducing pressure of the sintered metal body and the resin material applied to the surface of the sintered metal body so as to expel gas from the voids; and curing the resin material by heating.

A method of manufacturing a wavelength-conversion module according to the present disclosure comprises joining a wavelength-conversion member onto a base using a joining member, the method including: preparing a metal paste containing metal powder and applying the metal paste onto the base; arranging the wavelength-conversion member on the applied metal paste; joining the base and the wavelength-conversion member using a sintered metal body obtained by heating the metal paste and sintering the metal powder, the sintered metal body having a porous structure containing voids; and impregnating the voids of the sintered metal body with resin by the resin impregnation method.

A wavelength-conversion module according to the present disclosure includes: a base; a wavelength-conversion member provided on the base; and a joining member that joins the base and the wavelength-conversion member, the joining member including: a sintered metal body having a porous structure containing voids; a resin including a first resin portion covering an outer surface of the sintered metal body and a second resin portion with which the voids are impregnated; and particles dispersed in the resin, in which a concentration of the particles dispersed in the first resin portion is greater than a concentration of the particles dispersed in the second resin portion.

The resin impregnation method with the above-mentioned arrangement of the present disclosure is intended to provide a resin impregnation method that enables manufacture of a wavelength-conversion module with high reliability.

Further, the present disclosure enables providing the wavelength-conversion module with high reliability and a method of manufacturing the wavelength-conversion module.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF THE EMBODIMENT

Hereinafter, certain embodiments and examples for implementing the present disclosure will be described with reference to the drawings. Connection structures mentioned below are intended to embody the technical concepts of the present disclosure, and the present disclosure is not limited to the following unless otherwise specifically stated.

Throughout the respective drawings, members having the same function may be denoted by the same sign. For the sake of convenience and ease of explanation or understanding of the main points, the description below may be separately given for each embodiment or example, but the configurations of different embodiments or examples could be partially substituted or combined. In the following embodiments and examples, the description about matters common to the foregoing is omitted, and thus only differences therebetween will be explained. In particular, similar actions and effects with similar configurations will not be mentioned sequentially for each embodiment or example. The size, positional relationship, etc., of members illustrated in the respective drawings may be exaggerated for clarity of the explanation.

Certain embodiments according to the present disclosure will be described in detail below.

In the following description, the expression "excessive foaming" may be defined as foaming that occurs when bubbles become large and break or they are vigorously formed and break, on the surface of a resin material.

First Embodiment

Figure 1:
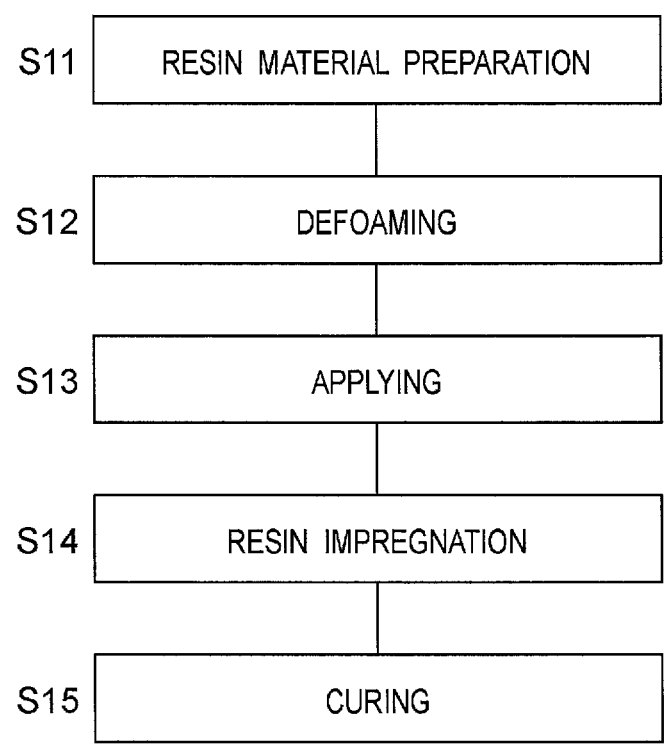
FIG. 1 is a process flow of a resin impregnation method according to the present disclosure.

A resin impregnation method according to a first embodiment is a method of impregnating voids of a sintered metal body having a porous structure with resin, the method including, as illustrated in FIG. 1:

(1) a resin material preparation S11 of preparing a resin material that contains a defoamer containing hydrophilic or hydrophobic particles;

(2) a defoaming S12 of defoaming the prepared resin material by reducing its pressure;

(3) an applying S13 of applying the defoamed resin material onto a surface of the sintered metal body;

(4) a resin impregnation S14 of impregnating the voids with the resin material by reducing pressure of the sintered metal body and the resin material applied to its surface so as to expel gas from the voids; and (5) a curing S15 of curing the resin material by heating.

Herein, the term "sintered metal body having a porous structure" as used in the present disclosure refers to, for example, a sintered body obtained by firing a metal paste containing metal powder. The sintered metal body includes a metal part with a mesh structure in which a plurality of metal particles are continuously connected by fusing adjacent metal particles at least in part, and voids formed in spaces, other than the fused part, between the plurality of adjacent metal particles. Therefore, in the sintered metal body having the porous structure as used in the present disclosure, voids are present between a wavelength-conversion member and a heat dissipation member in the case of a wavelength-conversion module, for example.

The term "porous material" generally refers to a material having a large number of fine pores, such as microporous material, mesoporous material, and macroporous material. The sintered metal body in the present disclosure can contain voids of various sizes, depending on, for example, the particle size distribution in the metal powder before sintering. Furthermore, for example, when the sintered metal body in the present disclosure is used as a joining member to join two members, there is also a void in an area sandwiched between the two members, thereby making it possible to more effectively secure enough strength to withstand thermal stress.

The resin impregnation method according to the first embodiment will be described in detail below.

(1) Resin Material Preparation S11

In the resin material preparation S11, a resin material that contains a defoamer containing hydrophilic or hydrophobic particles is prepared.

In this resin material preparation, first, a thermosetting epoxy resin, which is the main component of the resin material, is prepared. Although silicone resin or the like can be used, epoxy resin is more preferred because it has a high gas barrier property and thereby can shield the sintered metal body from the outside air after impregnation. Thermosetting epoxy resins that do not contain halogens such as chlorine are preferred. Types of the epoxy resin include alicyclic epoxy resins, bisphenol A diglycidyl ether, bisphenol F diglycidyl ether, hydrogenated bisphenol A diglycidyl ether, hexahydrophthalic acid diglycidyl ester, and the like. To use the epoxy resin in the form of a liquid product, various epoxy reactive diluents may be added to the epoxy resin. Among them, alicyclic epoxy resins are preferred. Alicyclic epoxy resins have excellent filling properties because of their low viscosity, and thus are less likely to generate voids. The glass transition temperature of the alicyclic epoxy resin can be increased to 200° C. or higher, and can be easily adjusted to an appropriate glass transition temperature according to a required heatproof temperature.

The defoamer containing hydrophilic or hydrophobic particles is prepared, for example, by blending and dispersing the hydrophilic or hydrophobic particles (powder) in a medium such as silicone oil. Here, in addition to silicone oil, highly hydrophobic surfactants can be used as the medium. However, the former, i.e., silicone oil is a foam-suppressing defoamer suitable for a non-water based resin, while the latter, i.e., the above-mentioned surfactants are foam-suppressing defoamers suitable for a water-based resin. In this embodiment, silicone oil is preferably used because most of the resin materials belong to the non-water based category. As for the hydrophilic or hydrophobic particles, hydrophilic silica, hydrophobic silica, and the like can be used. There are two types of defoamers: a foam-suppressing defoamer which can effectively suppress the generation of foam; and a foam-breaking defoamer which effectively breaks foam. The foam-suppressing properties are exerted when bubbles reach the surface of a liquid to inhibit the growth of the bubbles from the surface of the liquid to the outside. On the other hand, the foam-breaking properties are exerted after bubbles have grown and expanded from the surface of a liquid, making it easier for the bubbles to break. In the case of using the foam-breaking defoamer, bubbles themselves grow, and therefore it does not act to prevent the resin material from scattering or creeping up to the wavelength-conversion material.

The average particle size of the hydrophilic or hydrophobic particles to be blended and dispersed in the medium is set appropriately, taking into account the size of the void in an object to be impregnated and the settling of the particles during storage. For example, the average particle size is 0.001 μm or more and 20 μm or less, preferably 0.01 μm or more and 10 μm or less, and more preferably 0.05 μm or more and 5 μm or less. The content of the hydrophilic or hydrophobic particles in the medium is, for example, 0.001 parts by weight or more and 10 parts by weight or less, preferably 0.01 parts by weight or more and 5 parts by weight or less, and more preferably 0.1 parts by weight or more and 3 parts by weight or less, relative to 100 parts by weight of the medium.

The resin material is prepared by adding a predetermined amount of defoamer to the thermosetting epoxy resin prepared above and mixing them. The content of the defoamer in the epoxy resin is, for example, 0.001 parts by weight or more and 10 parts by weight or less, preferably 0.005 parts by weight or more and 5 parts by weight or less, and more preferably 0.01 parts by weight or more and 1 part by weight or less, relative to 100 parts by weight of the epoxy resin. The resin material can contain, for example, a wet conditioner or a viscosity adjuster.

The resin material can also contain a filler in order to prevent cracking during thermal shock. For example, a filler such as silica or alumina can be used.

(2) Defoaming S12

In the defoaming S12, the prepared resin material is defoamed by being held under a reduced pressure before application.

For example, in the case of placing the resin material in a syringe and applying it in the applying S13 mentioned below, the whole syringe filled with the resin material is placed in a vacuum defoaming apparatus and then defoamed for each syringe before the application. Reducing the pressure of the resin material to defoam it in this way enables efficient defoaming of bubbles which are contained in the resin material during the preparation of the resin material or filling of the syringe and which are very small and cannot float up to the surface of the resin due to their low buoyancy. For example, the degree of vacuum during this defoaming is set in the range from $10^{-3}$ Pa to $10^3$ Pa, preferably from $10^{-2}$ Pa to $10^2$ Pa, and more preferably from $10^{-1}$ Pa to 10 Pa.

Since the resin material of the first embodiment contains the defoamer, bubbles can be prevented from becoming large before defoaming even when the pressure of the resin material is reduced in the defoaming S12. Thus, for example, the resin material can be prevented from being spilled from the syringe.

(3) Applying S13

In the applying S13, the defoamed resin material is applied to the surface of the sintered metal body.

The amount of resin to be applied is set greater than or equal to an amount of resin with which all the voids of the sintered metal body are filled. Specifically, for example, the entire volume of voids in the sintered metal body is determined based on the sintered concentration of the sintered metal body and the whole volume of sintered metal body, and then the amount of resin to be applied is set in such a manner as to be greater than or equal to the determined entire volume of voids. Here, the resin material to be applied preferably has a low viscosity in consideration of filling the voids of the sintered metal body therewith, but lowering the viscosity of the resin material has the following issues. For example, in the case of using the sintered metal body as a joining member that joins two members, the surface of the sintered metal body with which the resin is to be applied is usually not horizontal but sloped. In such a case, the applied resin material may spread horizontally and reach areas where the resin material should not be applied, such as wire pads. Therefore, it is preferable to devise means for suppressing the horizontal spread of the applied resin material. The means for suppressing the horizontal spread of the resin material will be described in the embodiments below.

(4) Resin Impregnation S14

In the resin impregnation S14, the voids are impregnated with the resin material by reducing the pressure of the sintered metal body and the resin material applied to its surface so as to expel gas from the voids. The degree of vacuum during the impregnation is set appropriately in such a manner as to cause all the voids to be impregnated with the resin material while suppressing excessive foaming, based on the volume ratio of the voids in the sintered metal body and the size of the void. For example, the degree of vacuum is set in the range from $10^{-3}$ Pa to $10^3$ Pa, preferably from $10^{-2}$ Pa to $10^2$ Pa, and more preferably from $10^{-1}$ Pa to 10 Pa. Since air remaining under a chip has a certain, large volume in the applying S13 of the resin, it floats up to the surface of the resin by its own buoyancy, and is released to some extent from under the chip even at normal pressure, unlike the defoaming S12. However, this air is not completely released and therefore it is necessary to reduce the pressure of the resin. In the resin impregnation method of the first embodiment, the resin material contains the defoamer in which hydrophilic or hydrophobic particles are blended as mentioned above. Thus, in the resin impregnation S14, gas in the voids is expelled in the form of small bubbles to deform the resin material without allowing the bubbles to grow into large bubbles on the surface of the resin material even when the pressure of the resin material is reduced after applying the resin material. This enables removal of the gas inside the voids while suppressing the excessive foaming, thereby suppressing unnecessary scattering or spread of the resin material. The bubbles contained in the resin material itself are removed by the reducing its pressure before the application. Consequently, the foaming of the resin material due to the bubbles contained in the resin material itself can be suppressed. The hydrophilic or hydrophobic particles (powder) contained in the defoamer are less likely to penetrate into the centers of the voids of the sintered metal body because they are particles, and they do not need to penetrate into the centers. In other words, even if the particles stay near the surface of the sintered metal body with the resin material applied thereto, the foam-suppressing or breaking function of the particles is remained near the surface of the sintered metal body, whereby excessive foaming of the resin material is suppressed.

(5) Curing S15

In the curing S15, the resin material with which the voids are impregnated is cured by heating.

The resin impregnation method according to the first embodiment with the above-mentioned arrangement includes the defoaming S12 of defoaming the resin material by reducing its pressure before the application, so that the excessive foaming of the resin material due to bubbles contained in the resin material itself can be suppressed even when the pressure of the resin material is also reduced in the resin impregnation S14 after the application.

Since the resin material contains the defoamer in which hydrophilic or hydrophobic particles are blended, gas in the voids is expelled in the form of small bubbles to deform the resin material without allowing the bubble to grow into large bubbles in the resin material even when the pressure of the resin material is reduced after applying the resin material. This makes it possible to suppress excessive foaming of the resin material.

Therefore, according to the resin impregnation method of the first embodiment, the voids of the sintered metal body are allowed to be impregnated with the resin, while suppressing the unnecessary scattering and spread of the applied resin material.

Second Embodiment

A second embodiment relates to a wavelength-conversion module fabricated by a manufacturing method that includes the resin impregnation method of the first embodiment. The wavelength-conversion module converts the wavelength of light from a light-emitting element such as a semiconductor laser to another wavelength using a phosphor and emits the light with the converted wavelength.

Figure 2:
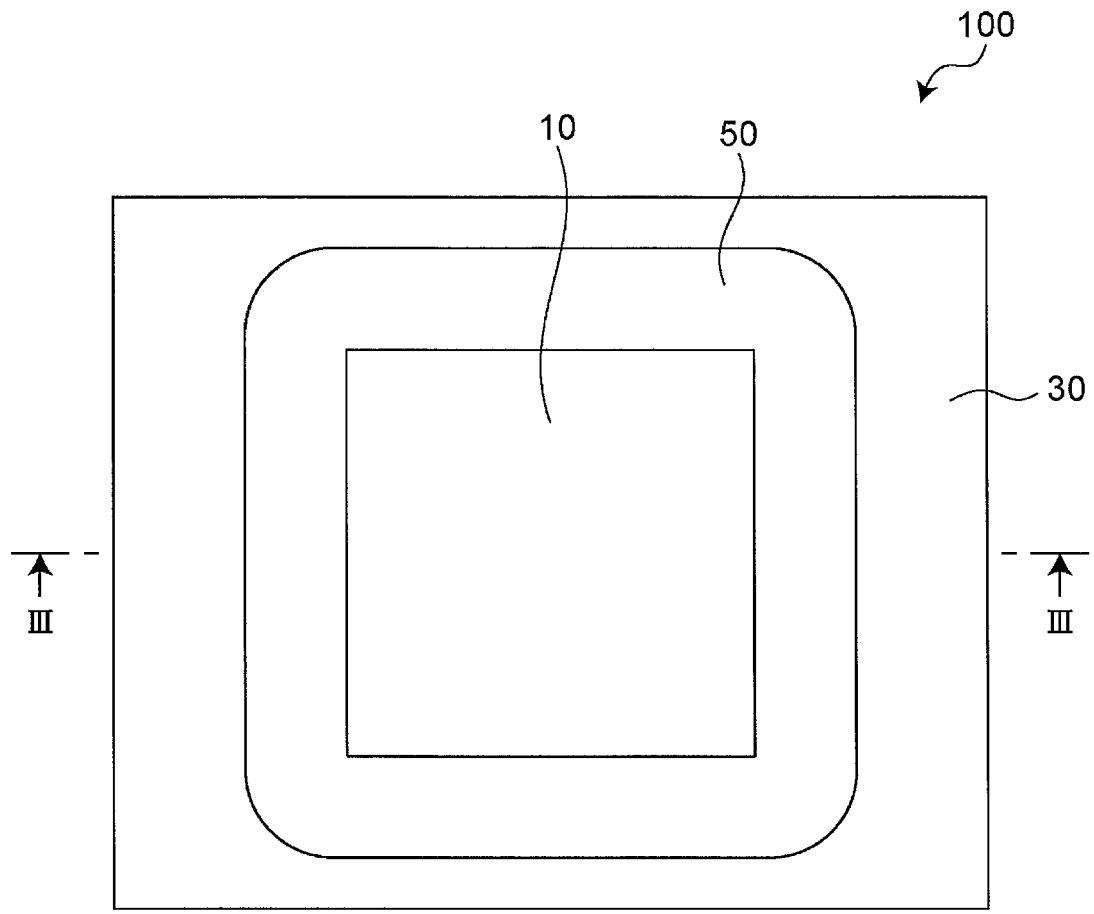
FIG. 2 is a top view of a wavelength-conversion module according to the present disclosure.
Figure 3:
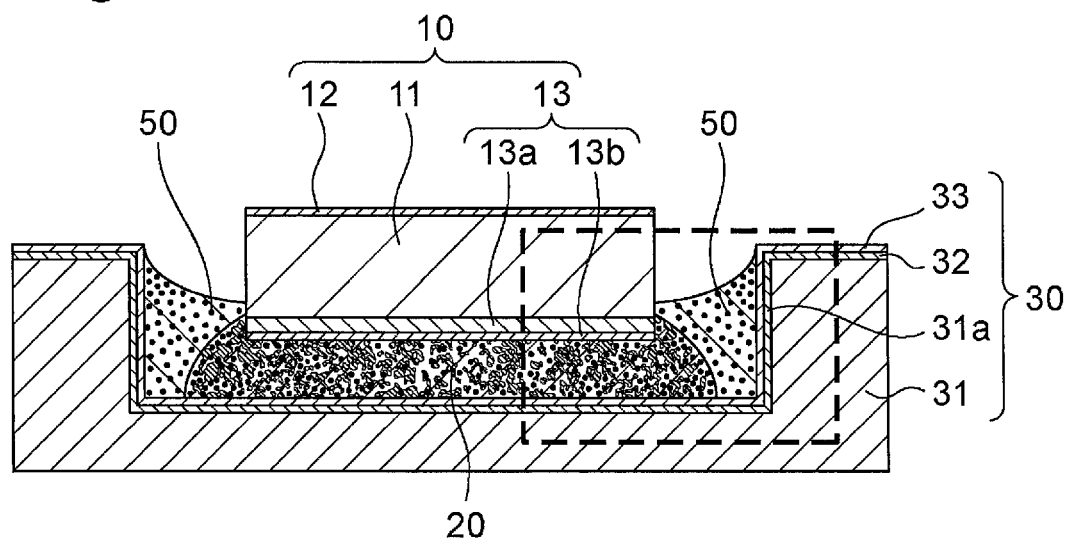
FIG. 3 is a sectional view of the wavelength-conversion module taken along the line III-III illustrated in FIG. 2.
Figure 4:
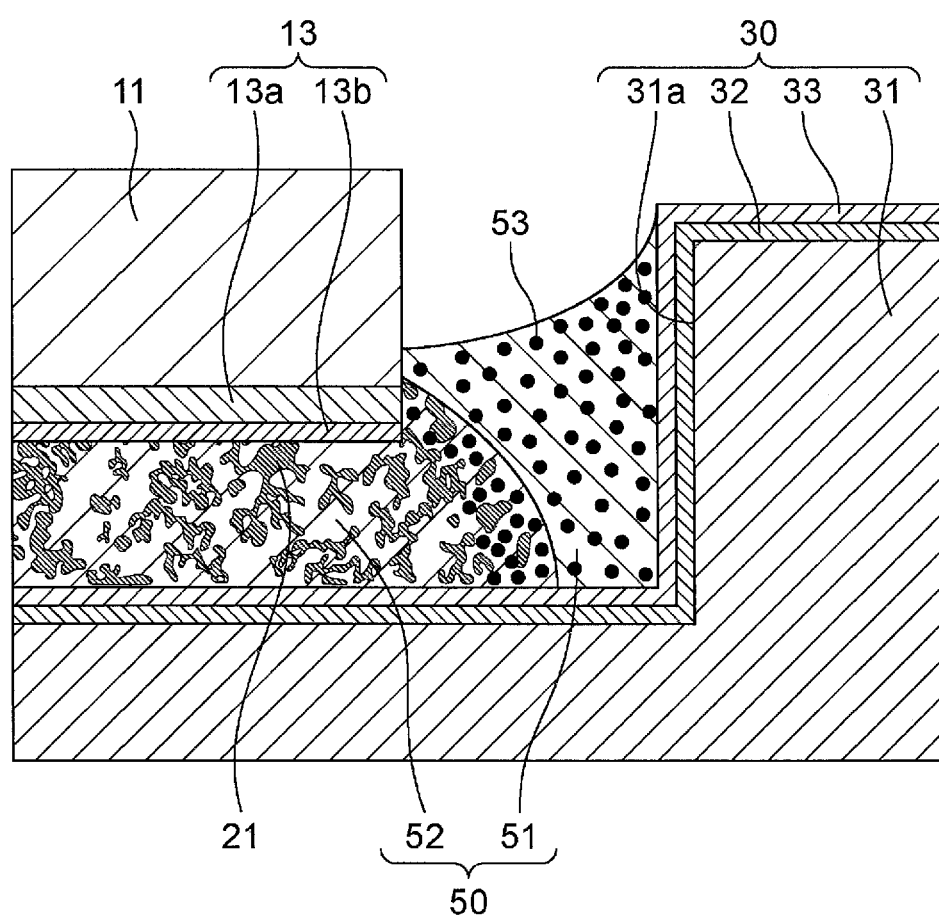
FIG. 4 is an enlarged sectional view illustrating a part of the sectional view of FIG. 3.

The wavelength-conversion module of the second embodiment will be described in detail below with reference to FIGS. 2 to 4. FIG. 2 is a top view of the wavelength-conversion module according to the present disclosure. FIG. 3 is a sectional view of the wavelength-conversion module taken along the line III-III illustrated in FIG. 2. FIG. 4 is an enlarged sectional view illustrating a part of the sectional view of FIG. 3.

The wavelength-conversion module 100 of the second embodiment includes a base 30, a wavelength-conversion member 10 provided on the base 30, and a joining member 20 that joins the base 30 and the wavelength-conversion member 10.

In the second embodiment, the base 30 includes a base portion 31 having a concave portion 31a, a first metal layer 32 provided on an upper surface of the base portion 31 including an inner surface of the concave portion 31a, and a second metal layer 33 provided on the first metal layer 32.

The wavelength-conversion member 10 includes a phosphor plate 11, an anti-reflection layer 12 provided on an upper surface of the phosphor plate 11, and a joining layer 13 provided on a lower surface of the phosphor plate 11.

The phosphor plate 11 can be composed of, for example, a YAG plate made of a sintered body of yttrium aluminum garnet or a LAG plate made of a sintered body of lutetium aluminum garnet. The phosphor plate 11 is preferably composed of a YAG plate.

The anti-reflection layer 12 can be composed of a metal oxide such as $SiO_2$, $Nb_2O_5$, or $TiO_2$, or a nitride such as SiN, GaN, or AlN. The anti-reflection layer 12 is preferably composed of $SiO_2$.

The joining layer 13 includes a light-shielding layer 13a provided on the lower surface of the phosphor plate 11 and a metal joining layer 13b provided on a lower surface of the light-shielding layer 13a. The light-shielding layer 13a can be composed of, for example, an $Al_2O_3$ film, a $SiO_2$ film, a $Nb_2O_5$ film, or a $TiO_2$ film. The light-shielding layer 13a is preferably composed of an $Al_2O_3$ film. The metal joining layer 13b can be composed of, for example, an Ag film, a lamination of a Ni film and an Ag film, a lamination of an Ag film and an Au film, a lamination of an Al film and an Ag film, an Au film, a lamination of an Al film and an Au film, and a lamination having an arbitrary metal layer as a barrier layer for adhesion and heating sandwiched between the films of the above-mentioned lamination. The joining layer 13b is preferably composed of an Ag film.

In the second embodiment, the base 30 and the wavelength-conversion member 10 are joined via the joining member 20. The joining member 20 includes a sintered metal body 21 having a porous structure containing voids, a resin 50, and particles 53 dispersed in the resin 50. The resin 50 includes a first resin portion 51 covering an outer surface of the sintered metal body 21 and a second resin portion 52 with which the voids are impregnated. Here, the sintered metal body preferably contains silver or copper, and more preferably contains silver. Both the first resin portion 51 and the second resin portion 52 can contain the particles 53. The second resin portion 52 hardly contains particles 53 inside the sintered metal body 21, and the particles 53 are located near the outer surface of the sintered metal body 21. In other words, in the second resin portion 52, the concentration of the particles 53 contained in a part of the second resin portion 52 located near the outer surface of the sintered metal body 21 is greater than the concentration of the particles 53 contained in a part of the second resin portion 52 located inside the sintered metal body 21. Further, the concentration of the particles 53 dispersed in the first resin portion 51 is greater than the concentration of the particles 53 dispersed in the second resin portion 52 inside the sintered metal body 21.

The dispersed particles 53 act on the surfaces of bubbles in the resin material, which is used to form the resin 50 during the manufacture, when the bubbles reach the surface of the liquid resin material, thereby destabilizing the surfaces of the bubbles by disrupting the arrangement of the resin material. In this way, the particles 53 have the function of inhibiting the growth of the bubbles from the liquid surface. As mentioned below, the foam-suppressing function of the particles 53 in the resin member only needs to be remained within the first resin portion 51, and thus the second resin portion 52 may not substantially contain the particles 53.

In the joining member 20, the sintered metal body 21 can have a fillet that spreads toward the base 30, and the fillet can cover at least a portion of the side surfaces, i.e., the lateral surfaces of the wavelength-conversion member 10. When the sintered metal body 21 contains the fillet covering a portion of the side surfaces of the wavelength-conversion member 10, the surface of the fillet is covered with the first resin portion 51. The thickness of the first resin portion 51 on the fillet surface is preferably 1 μm or more. If the thickness of the first resin portion 51 on the fillet surface is sufficient, the sintered metal body is shielded from the outside air, and thus can be protected from sulfurization and oxidation. The thickness of the first resin portion 51 on the fillet surface can be checked with a cross-sectional SEM, for example.

The sintered metal body 21 may contain spacer particles to make the thickness of the joining member 20 greater than or equal to a certain thickness, which allows the thickness of the sintered metal body 21 or joining member 20 between the base and the wavelength-conversion member to be the same or thicker than the particle size of the spacer particles. The spacer particles can be composed of zirconia particles, glass particles, silica particles, or alumina particles. The spacer particles are preferably composed of zirconia particles. The particle size of the spacer particles can be set appropriately in consideration of the spacing which is to be secured between the base and the wavelength-conversion material. The particle size of the spacer particles is set in the range of 20 μm or more and 500 μm or less, preferably in the range of 50 μm or more and 300 μm or less, and more preferably in the range of 100 μm or more and 200 μm or less.

The wavelength-conversion module 100 of the second embodiment with the above-mentioned configuration can be provided by the manufacturing method including the resin impregnation method of the first embodiment as mentioned in detail below so as to have high wavelength-conversion efficiency without any contamination of the upper surface (emission surface) of the wavelength-conversion member 10 due to the resin material in forming the resin 50.

In addition, the occurrence of blooming and bleeding on the surface of the resin 50 can be prevented by manufacturing the wavelength-conversion module 100 using the manufacturing method including the resin impregnation method of the first embodiment. This makes it possible to provide the wavelength-conversion module with highly elaborate design when viewing the wavelength-conversion module from the light-emitting surface side.

While wavelength-conversion module 100 of the second embodiment with the above-mentioned configuration has been described using an example of the base 30 which has a package structure with an annular convex portion for forming the concave portion 31a, the wavelength-conversion module 100 may be configured using a plate-shaped substrate as the base.

When a plate-shaped substrate is used as the base, instead of the annular convex portion for forming the concave portion 31a, it is preferable to form an annular convex or concave part with a lower profile structure than the annular convex portion for forming the concave portion 31a, on the upper surface of the base (the substrate). The annular convex or concave part having the lower profile structure can be at a lower height than the thickness of the sintered metal body. The annular convex or concave part can stop the resin 50 from spreading due to surface tension when it is formed.

(Method of Manufacturing Wavelength-Conversion Module 100)

Figure 5:
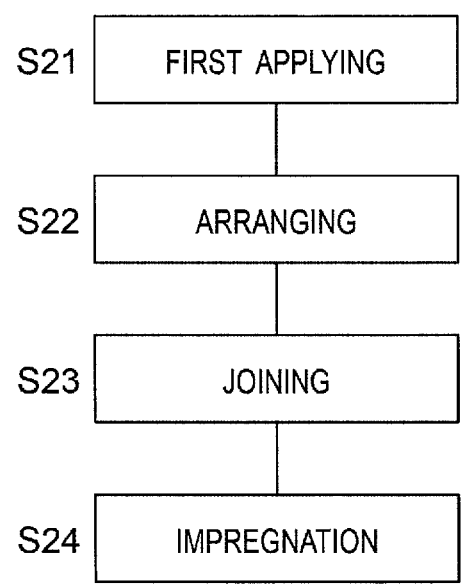
FIG. 5 is a process flow of a method of manufacturing a wavelength-conversion module according to the present disclosure.

The manufacturing method of the wavelength-conversion module 100 includes a first applying S21, an arranging S22, a joining S23, and an impregnation S24 including the resin impregnation method of the first embodiment, as illustrated in FIG. 5.

In the first applying, a metal paste containing metal powder is prepared, and the metal paste is applied onto the base.

In the arranging, the wavelength-conversion member is arranged on the applied metal paste.

In the joining, the metal paste is heated to sinter the metal powder, thereby joining the base and the wavelength-conversion member using the sintered metal body having a porous structure containing voids.

In the impregnation, the voids of the sintered metal body are impregnated with resin by using the resin impregnation method of the first embodiment.

Hereinafter, each process will be described in detail.

In the manufacturing method of the wavelength-conversion module 100, the processes from the first applying to the impregnation are carried out after preparing the wavelength-conversion member 10 and the base 30 mentioned above.

1. First Applying S21

Here, the metal paste containing the metal powder is first prepared.

(1) Preparation of Metal Paste

In the description below, the case of using silver particles as the metal particles will be described below, and the metal paste will be referred to as a silver paste.

(1-1) Preparation of Silver Particles

The shape of the silver particles to be prepared is not limited particularly to, but may be, for example, a substantially spherical shape or a flake shape. The expression that the silver particle has a "substantially spherical shape" as used herein means that the aspect ratio (a/b), which is defined as the ratio of the major axis a to the minor axis b, of the silver particle is less than or equal to two. The expression that the silver particle has a "flake shape" as used herein means that the aspect ratio of the silver particle is greater than 2. The major axis a and the minor axis b of the silver particle can be measured by image analysis with the SEM.

The silver particles to be prepared have an average particle size of, for example, 0.3 µm or more, preferably 0.5 µm or more, more preferably 1 µm or more, and still more preferably 2 µm or more. The silver particles preferably have an average particle size of, for example, 10 µm or less, and more preferably 5 µm or less. When the average particle size of the silver particle is 0.5 µm or more, and more preferably 1 µm or more, the silver particles do not aggregate without forming a protective film such as a capping agent on the surfaces of the silver particles, thus eliminating the need for thermal decomposition of the protective film and enabling sintering at a low temperature. The larger particle size of silver particles improves the fluidity of the silver paste. Thus, if silver pastes have the same fluidity (workability), the silver paste containing silver particles with sizes in this specified range could contain more silver particles. When the average particle size is 10 µm or less, and more preferably 5 µm or less, the melting point depression phenomenon occurs due to the larger specific surface area of the silver particles, and as a result, the sintering temperature can be lowered. The particle size of silver particles can be measured by a laser diffraction method. The term "average particle size" as used herein means the volume-based median diameter (which is a value obtained when a cumulative volume frequency determined from the particle size distribution is 50%) measured by the laser diffraction method.

As the silver particles to be prepared, preferably, the content of silver particles with a particle size of less than 0.3 µm in the silver paste is 5% by mass or less. More preferably, the content of silver particles with a particle size of 0.5 µm or less is 15% by mass or less. Silver particles tend to be sintered at a lower temperature as the particle size decreases. In particular, nano-sized silver particles are sintered at a lower temperature than micro-sized silver particles. Thus, if the content of nano-sized silver particles in the silver paste is large, sintering may start at a low temperature, and fusion may occur without sufficient contact between the silver particles.

The silver particles to be prepared may have a small amount of silver oxide films or silver sulfide films present on their surfaces. Since silver is a noble metal, the silver particles themselves are less likely to be oxidized and are very stable. However, when viewed in a nano-sized region, they tend to adsorb sulfur, oxygen, etc., from the air or the like, thereby forming a thin film on the surface of the silver particle. The thickness of the oxide film or sulfide film of silver particles is preferably 50 nm or less and more preferably 10 nm or less.

1-2. Mixing of Silver Particles and Organic Solvent

Here, the prepared silver particles are mixed with an organic solvent as a dispersion medium.

Further, the silver paste may contain resin or the like.

The content of silver particles when mixed is preferably 70% by mass or more, and more preferably 85% by mass or more. The resin that can be mixed with the silver paste is one that decomposes upon heating during firing as mentioned below, and does not remain in the formed joining body. The resin may be, for example, polystyrene (PS) or polymethyl methacrylate (PMMA). Mixing the silver particles with an organic solvent, which is the dispersion medium, makes it easier to apply the silver paste with the desired thickness onto the surface of the base. The organic solvent used here can be one type of organic solvent or a mixture of two or more types of organic solvents. For example, a mixture of a diol and an ether can be used. The boiling point of the organic solvent is preferably in the range of 150° C. or higher and 250° C. or lower. The organic solvent having a boiling point of 150° C. or higher can prevent contamination of the silver particles with the atmosphere and chip dropout that would be caused due to the drying of the silver paste before the heating. The organic solvent having a boiling point of 250° C. or lower can increase the volatilization rate during the heating and accelerate sintering.

In addition to the silver particles and the dispersion medium, additives such as a dispersant, a surfactant, a viscosity adjuster, and a diluting solvent, as well as spacer particles may be mixed with the silver paste. As the content of the additives in the silver paste, the total amount of additives in the silver paste may be 5% by mass or less, for example, in the range of 0.5% by mass or more and 3% by mass or less. In particular, the addition of the spacer particles is desirable because it enables reproducible control of the thickness of the metal paste, which in turn allows for stable impregnation of the resin.

Although the above description has been given on an example of the silver paste composed of the silver particles, this embodiment is not limited to the silver paste, but can also use a metal paste containing metal particles other than silver particles, such as copper particles.

(2) Application of the Prepared Metal Paste onto Base

Here, the metal paste is applied onto the base 30.

Specifically, the prepared metal paste is applied onto the bottom surface of the concave portion 31a.

As the application method of the metal paste, appropriate known methods can be adopted, and examples thereof include screen printing, offset printing, inkjet printing, flexographic printing, dispenser printing, gravure printing, stamping, dispensing, squeegee printing, silk screen printing, spraying, brushing, coating, and the like. The appropriate thickness of the applied metal paste can be set according to the applications or the like. For example, it can be 1 μm or more and 1000 μm or less, preferably 5 μm or more and 800 μm or less, and more preferably 10 μm or more and 500 μm or less.

2. Arranging S22

The wavelength-conversion member 10 is placed on top of the metal paste applied onto the bottom surface of the concave portion 31a. For example, the wavelength-conversion member 10 is placed from above the metal paste and pressed against the metal paste such that the metal paste between the bottom surface of the concave portion 31a and the wavelength-conversion member 10 reaches a predetermined thickness, preferably such that the metal paste creeps up on parts of the side surfaces of the wavelength-conversion member 10.

3. Joining S23

In the joining, by heating the metal paste, the organic solvent is volatilized and the metal particles are fused, thereby sintering the metal powder. Consequently, the base 30 and the wavelength-conversion member 10 are joined by the sintered metal body having a porous structure containing the voids.

The heating and firing here can also be performed by heating in a reducing atmosphere, followed by firing in an oxidizing atmosphere, as appropriate.

(1) Heating Temperature (1-1) Heating in Reducing Atmosphere

Heating in a reducing atmosphere is optional and thus performed as appropriate, as mentioned above. The heating in the reducing atmosphere is performed to remove a small amount of oxide films or the like present on the surfaces of the metal particles, through the reduction. Consequently, metal atoms are exposed on the surfaces of the metal particles, thereby promoting the surface diffusion of metal atoms on the surfaces of the metal particles. Therefore, the sintering of metal particles can be promoted at a low temperature by the subsequent heating in an oxidizing atmosphere.

The heating in the reducing atmosphere and the heating in the oxidizing atmosphere, which will be described later, may be performed in separate devices, but they are preferably performed in the same device. Thus, the heating in the reducing atmosphere and the heating in the oxidizing atmosphere can be continuously performed in the same device. The reducing atmosphere is preferably a formic-acid containing atmosphere or a hydrogen containing atmosphere. For example, it is preferably a mixture of a formic acid or hydrogen with an inert gas such as nitrogen. The reducing atmosphere more preferably contains a formic acid. For example, it is preferably a mixture of a formic acid with an inert gas such as nitrogen.

The heating in the reducing atmosphere is performed, for example, at a temperature of lower than 300° C., preferably 280° C. or lower, more preferably 260° C. or lower, and still more preferably 200° C. or lower. The heating in the reducing atmosphere is preferably performed, for example, at a temperature of 150° C. or higher, more preferably 160° C. or higher, and still more preferably 180° C. When the heating temperature is 150° C. or higher, more preferably 160° C. or higher, and still more preferably 180° C. or higher, the reaction rate of the reduction reaction of the oxide film present on the silver particle surface can be accelerated. The pressure at which the heating is performed in the reducing atmosphere is not particularly limited, but may be an atmospheric pressure, for example.

(1-2) Firing in Oxidizing Atmosphere

Here, by heating and firing in an oxidizing atmosphere, the metal particles are fused together to form the sintered metal body. The oxidizing atmosphere is preferably an oxygen-containing atmosphere, and more preferably an atmospheric atmosphere. When the oxidizing atmosphere is an oxygen-containing atmosphere, the oxygen concentration in the atmosphere is preferably in the range of 2% by volume or more and 21% by volume or less. The higher the oxygen concentration in the atmosphere, the more the surface diffusion of metal atoms on the surfaces of the metal particles is promoted, and the more easily the metal particles tend to be fused together. When the oxygen concentration is 2% by volume or higher, the metal particles can be fused together at a lower heating temperature. When the oxygen concentration is 21% by volume or lower, a pressurizing mechanism is not required in a heating device, thus enabling the reduction in the process cost.

(2) Firing Temperature

The firing temperature in the oxidizing atmosphere is, for example, 300° C. or lower, preferably 280° C. or lower, more preferably 260° C. or lower, and still more preferably 200° C. or lower. By heating in the reducing atmosphere before the firing in the oxidizing atmosphere, the firing can be performed at a lower temperature.

The firing in the oxidizing atmosphere is preferably performed, for example, at a temperature of 150° C. or higher, and more preferably 160° C. or higher. By setting the firing temperature to 150° C. or higher and more preferably 160° C. or higher, the sintered metal body with low electrical resistivity and good thermal conductivity properties can be formed.

The firing in the oxidizing atmosphere may be performed under a pressurized condition, for example, under an atmospheric pressure.

4. Impregnation S24

In the impregnation, the voids of the sintered metal body are impregnated with resin according to the resin impregnation method of the first embodiment.

Here, the resin material that contains the defoamer containing the hydrophilic or hydrophobic particles is prepared (resin material preparation S11).

Before the prepared resin material is applied, it was defoamed by reducing its pressure (defoaming S12). For example, the syringe is filled with the resin material, placed itself in a vacuum defoaming apparatus, and then defoamed for each syringe before the application.

Next, the defoamed resin material is applied onto a surface of the sintered metal body (applying S13). Here, the resin material obtained after the defoaming is applied, for example, by the syringe onto the inside of the outer concave portion 31a of the wavelength-conversion member 10, i.e., in a region between the side surface of the concave portion 31a and the surface of the fillet.

Next, gas in the voids is expelled by reducing the pressure of the resin material applied onto the surface of the sintered metal body (the surface of the fillet), thereby impregnating the voids with the resin material (resin impregnation S14).

Finally, the resin material with which the voids are impregnated is cured by heating (curing S15).

In the way mentioned above, the wavelength-conversion module of the second embodiment is fabricated.

According to the above-mentioned manufacturing method of the wavelength-conversion module, the resin portion 50 can be formed by impregnating the voids of the sintered metal body 21 with the resin material, while suppressing excessive foaming through the pressure reduction in the resin impregnation without allowing the resin material to creep up on the light-emitting surface of the wavelength-conversion member 10.

Therefore, the wavelength-conversion module fabricated by the manufacturing method can enhance its thermal stress durability by causing the resin to be included in the voids of the sintered metal body 21, and can suppress the reduction in light extraction efficiency due to the absence of contamination of the light-emitting surface with the resin material, resulting in high luminous efficiency.

EXAMPLES

Example 1

In Example 1, the wavelength-conversion module 100 illustrated in FIG. 2 was fabricated in the following manner.
Preparation of Base 30

The base 30 was prepared to include the base portion 31 made of copper and having the concave portion 31a, the base portion being provided with a Ni plating layer of 2 μm in thickness as the first metal layer 32, and an Au plating layer of 0.05 μm in thickness as the second metal layer 33.
(2) Fabrication of Wavelength-Conversion Member 10

In this example, an integrally sintered alumina-YAG plate of 0.2 mm in thickness was prepared as the phosphor plate 11. Here, the prepared YAG plate contains $Y_2O_3$, $Al_2O_3$, and $CeO_2$.

Then, an $Al_2O_3$ film of 1 μm in thickness was deposited on a lower surface of the YAG plate by sputtering, and an Ag film of 0.5 μm in thickness was deposited on top of the $Al_2O_3$ film by sputtering.

In addition, a $SiO_2$ film of 0.11 μm in thickness was deposited on an upper surface of the YAG plate by sputtering. Consequently, a wavelength-conversion member plate in which a plurality of wavelength-conversion members 10 were integrated was fabricated.

Then, the wavelength-conversion member plate was singulated by dicing into wavelength-conversion members 10, each having dimensions of 5.5 mm×5.5 mm×0.2 mm.

(3) Preparation and Application of Metal Paste and Arrangement of Wavelength-Conversion Member A silver paste was prepared as the metal paste to join the wavelength-conversion member 10 to the base 30. To prepare the silver paste, first, 2-ethyl-1,3-hexanediol (0.852 g), diethylene glycol monobutyl ether (0.213 g), which were organic solvents, and an anionic liquid surfactant (manufactured by Sanyo Chemical Industries, Ltd., trade name "Viewlite LCA-H", laureth-5-carboxylic acid, liquid at 25° C., 0.150 g) were mixed and stirred with a rotating-revolving mixer (trade name "Awatori Rentaro AR-250" manufactured by Thinky Corporation) for one minute, followed by defoaming for one cycle of 15 seconds while stirring, thereby producing a solvent mixture.

Next, flake-shaped silver particles (manufactured by Fukuda Metal Foil & Powder Co., Ltd., product name "AgC-239", flake-shaped, average particle size (median diameter) of 2.5 μm, specific surface area of 0.7 m²/g, the content of particles with a particle size of less than 0.3 μm being 2% by mass, the content of particles with a particle size of 0.5 μm or less being 6% by mass, 13.776 g) as well as zirconia particles with a particle size of 100 μm (manufactured by NIKKATO CORPORATION, trade name "YTZ Ball", 0.009 g) as spacer particles were weighed and added to the above-mentioned solvent mixture. The resulting mixture was stirred for one minute and defoamed for 15 seconds, which were set as one cycle, with the rotating-revolving mixer (trade name: "Awatori Rentaro AR-250", manufactured by Thinky Corporation) to obtain a silver paste (not containing any resin).

Next, the prepared silver paste was applied onto the bottom surface of the concave portion 31a of the base 30.

Subsequently, the wavelength-conversion member 10 was arranged on the applied silver paste using a die bonder.
(4) Joining The base 30 with the wavelength-conversion member arranged therein was placed in an oven and fired, so that the silver powder contained in the fired silver paste was sintered in the atmosphere to join the base 30 and the wavelength-conversion member 10.

The firing temperature was raised to 200° C. at a temperature-increase rate of 0.24° C./min and held at 200° C. for one hour to sinter the silver powder.
(5) Preparation of Impregnation Resin First, as an impregnating resin, foam-suppressing silicone oil compound type (containing silica particles) defoamer KS-66 (manufactured by Shin-Etsu Chemical Co. Ltd., 0.005 g, 0.13) was added to epoxy resin CELVENUS W221 (manufactured by Daicel Corporation, two-component type, thermosetting type, 5.000 g) to thereby fabricate a resin material.
(6) Defoaming Before Application of Resin Material An applicating syringe was filled with the prepared resin material, which was then defoamed by the vacuum defoaming apparatus for each syringe.

The defoaming was performed using an oil-sealed rotary vacuum pump (manufactured by ULVAC, Inc., GLD-136C) with an ultimate vacuum of 0.67 Pa for 30 seconds as defoaming conditions.
(7) Application of Resin Material The resin material was applied onto the inside of the concave portion 31a with an air dispenser using the syringe in which the defoamed resin material was placed. Specifically, by filling a space between the inner circumferential wall of the concave portion 31a and an outer circumferential side surface of the wavelength-conversion member with resin material, the resin material was applied onto the surface of the fillet formed on the periphery of the wavelength-conversion member of the sintered silver body.

(8) Impregnation with Resin Material

After applying the resin material, the base 30 with the wavelength-conversion member 10 joined thereto was subjected to pressure reduction in the vacuum defoaming apparatus to expel air from the voids of the sintered silver body, causing the voids to be impregnated with the resin material. The pressure reduction was performed using the oil-sealed rotary vacuum pump (manufactured by ULVAC, Inc., GLD-136C) with an ultimate vacuum of 0.67 Pa for 10 minutes as pressure reducing conditions.

(9) Resin Curing

The whole base 30 to which the wavelength-conversion member 10 was joined was heated in the atmosphere using an oven to cure the resin material. Curing conditions were set to 150° C. and one hour.

The wavelength-conversion module of Example 1 fabricated as mentioned above enabled impregnation of all the voids of the joining member with the resin, and also enabled efficient wavelength conversion without contamination of the upper surface (the light-emitting surface) of the wavelength-conversion member due to the resin material. In this way, the wavelength-conversion module with higher reliability can be produced.

Comparative Example 1

A wavelength-conversion module of Comparative Example 1 was fabricated in the same manner as in Example 1, except that an impregnated resin which did not contain a defoamer was used.

In the wavelength-conversion module of Comparative Example 1, the upper surface (the light-emitting surface) of the wavelength-conversion member was contaminated with the resin material, and the wavelength-conversion efficiency was inferior to that of the wavelength conversion module of Example 1.

The resin impregnation method according to the present embodiments can be used to fix semiconductor elements or sub-mount substrates. The wavelength-conversion module and its manufacturing method can be used in automobile headlights, lighting fixtures, projectors, and other applications.

What is claimed is:

1. A wavelength-conversion module comprising:
   a base;
   a wavelength-conversion member provided on the base; and
   a joining member that joins the base and the wavelength-conversion member, wherein the joining member includes:
   a sintered metal body having a porous structure containing voids;
   a resin including a first resin portion that covers an outer surface of the sintered metal body and a second resin portion that is disposed in the voids; and
   particles dispersed in the resin,
   wherein a concentration of the particles dispersed in the first resin portion is greater than a concentration of the particles dispersed in the second resin portion.

2. The wavelength-conversion module according to claim 1, wherein the second resin portion does not substantially contain the particles.

3. The wavelength-conversion module according to claim 1, wherein the sintered metal body has a fillet that covers at least a portion of the side surfaces of the wavelength-conversion member.

4. The wavelength-conversion module according to claim 1, wherein the surface of the fillet is covered with the first resin portion, the thickness of the first resin portion being 1 μm or more.

5. The wavelength-conversion module according to claim 1, wherein the sintered metal body contains silver or copper.

6. The wavelength-conversion module according to claim 1, wherein the base has an annular convex portion surrounding the wavelength-conversion member.

7. The wavelength-conversion module according to claim 1, wherein the wavelength-conversion member comprises a phosphor plate with a lower surface facing the base and an upper surface, and a $SiO_2$ film provided on the upper surface of the phosphor plate.

8. The wavelength-conversion module according to claim 1, wherein the wavelength-conversion member comprises a phosphor plate with a lower surface facing the base and an upper surface, an $Al_2O_3$ film provided on the lower surface of the phosphor plate and an Ag film provided on a lower surface of the $Al_2O_3$ film.

9. The wavelength-conversion module according to claim 1, wherein the sintered metal body further contains spacer particles and the thickness of the sintered metal body between the base and the wavelength-conversion member is the same or thicker than the particle size of the spacer particles.

* * * * *